United States Patent
Barr

[19]

[11] Patent Number: 6,043,708

[45] Date of Patent: Mar. 28, 2000

[54] FULLY COMPLEMENTARY FOLDED CASCODE AMPLIFIER

[75] Inventor: Keith Barr, Los Angeles, Calif.

[73] Assignee: Alesis Studio Electronics, Inc., Santa Monica, Calif.

[21] Appl. No.: 09/089,764

[22] Filed: Jun. 3, 1998

[51] Int. Cl.[7] .................................................. H03F 3/45
[52] U.S. Cl. ........................................ 330/253; 330/255
[58] Field of Search .................................. 330/253, 255, 330/301

[56] References Cited

U.S. PATENT DOCUMENTS

| | | | |
|---|---|---|---|
| 4,918,398 | 4/1990 | Huijsing et al. | 330/252 |
| 5,321,370 | 6/1994 | Yukawa | 330/258 |
| 5,610,557 | 3/1997 | Jett, Jr. | 330/261 |

Primary Examiner—Robert Pascal
Assistant Examiner—Henry Choe
Attorney, Agent, or Firm—Finnegan, Henderson, Farabow, Garrett & Dunner, L.L.P.

[57] ABSTRACT

A method and apparatus for decreasing the supply current to peak output current ratio of a fully complementary cascode amplifier. The amplifier has two shunt portions coupled to a pair of differential input signals and to an output portion which, in turn, is coupled to a pair of output terminals. Based on the relative magnitudes of the input signals, the first shunt portion selectively diverts current from the output portion while the second shunt portion selectively supplies current to the output portion.

9 Claims, 2 Drawing Sheets

FULLY COMPLEMENTARY FOLDED CASCODE AMPLIFIER

BACKGROUND

The present invention relates generally to folded cascode amplifiers and, more particularly, to fully complementary folded cascode amplifiers with low supply current to peak output current ratios.

In switched capacitor circuits, a signal is first sampled as a voltage onto a capacitor on one phase of a non-overlapping driving clock, and then delivered as a charge to an integrator on the opposite clock phase. As charge is delivered to an integrator, the integrator output must settle within an acceptable time limit before the end of the clock phase or an error in the charge transfer results. Often, to reduce the effects of external noise within a switched capacitor system, a differential signal is sampled into two capacitors and delivered to a fully differential amplifier that is configured as an integrator with two feedback capacitors. A traditional folded cascode amplifier is often used in this application, as it settles quickly, often requires no additional compensation, and has high open loop gain.

The traditional folded cascode amplifier is illustrated schematically in FIG. 1, constructed with CMOS technology. In this configuration, complementary current sources act upon the output. NMOS devices N0, N2, N1 and N3 pull the outputs out+ and out− toward ground, while PMOS devices P3, P5, P4 and P6 pull the outputs out+ and out− toward the supply voltage. The polarity of the current sources is affected by the differential currents of a differential input device pair P0, P1. Devices P0 and P1 proportion current sourced by devices P2 and P7 to the junctions between the N type current sources depending on the differential voltage input across input terminals in+ and in−, thereby reducing the amount of current available from the N type current sources to the output terminals out+ and out−. A bias generator (not shown) generates fixed bias voltages Vb1, Vb2, Vb3, and Vb4 to ensure that the currents through the devices are appropriate, and all devices operate in their saturation region. The bias voltages are adjusted by the bias generator so the outputs always remain within an acceptable output common mode voltage range.

In operation, devices N0 and N1 are scaled and biased so each conducts two units of current, while devices P3 and P4 are biased to conduct one unit each. The differential input devices P0 and P1 are supplied with two units of current from device P2, which is biased to conduct two units of current. Under steady state conditions, with zero differential input voltage, these two units of current are equally distributed to N0 and N1 so that the currents through cascode devices P5, P6, N2, and N3 are each one unit of current, and the total supply current is four units. Under these conditions, no current flows to the output terminals out+ and out−.

When a large differential input voltage is applied to input terminals in+ and in−, the differential input devices P0 and P1 become unbalanced. In the most extreme case, the full two units of current from device P2 are diverted to only one of the N type current sources. For example, if the voltage on terminal in+ is very much more positive than the voltage on terminal in−, the two units of current from device P2 are diverted through device P1 and device N0 to ground. Thus, output terminal out+ is supplied with one current unit from device P3, but is not pulled low because no current flows through device N2. Output terminal out−, on the other hand, is pulled high by current source P4 at one current unit and low by device N3 at two current units, resulting in a net current of one current unit toward ground. Output terminal out+, on the other hand, is supplied with one current unit from device P3, but is not pulled low because no current flows through device N0. Thus, output terminal out+ outputs one current unit while, as noted, the amplifier is supplied by four current units. Excluding the supply current requirements of the bias generating circuitry, the supply current to peak output current ratio, then, is four to one.

A four-to-one supply current to peak output current ratio, however, can be inefficient for high performance applications. In such applications, it is desirable to have a high signal to noise ratio (SNR) and often for the circuit to support a high clock frequency. As discussed in more detail below, however, satisfying either of these design criteria requires increasing the peak output current of the amplifier. In amplifiers with a large supply current to peak output current ratio, however, a proportional increase in supply current accompanies even a modest increase in peak output current. This results in undesirable increases in power and dissipation requirements.

The SNR of switched capacitor circuits is the ratio of the input charge magnitude to the input charge noise. The input charge magnitude ($q_{in}$) after the input phase is complete is given by:

$$q_{in} = C_{in} * V_{in}$$

where $C_{in}$ is the total input capacitance and $V_{in}$ is the input voltage. The noise properties of switched capacitor circuits can be shown to be dominated by the folded thermal noise of the switches. The input charge noise ($q_{n,input}$) is given by:

$$q_{n,input} = (2KTC_{in})^{0.5}$$

where:

K=Boltzman's constant, and

T=absolute temperature.

Thus, the SNR is:

$$SNR = q_{in}/q_{n,input} = V_{in}(C_{in}/2KT)^{0.5}.$$

It is clear from this equation that an increase in the input capacitance values results in an increased signal to noise ratio.

An increase in input capacitance values, however, increases the settling time of the circuit, thus reducing the speed at which the circuit can be clocked. The settling time ($t_{st}$) of a well designed integrator stage is essentially composed of two parts: an initial slew period ($t_{slew}$), where the differential input voltage is significantly greater than the differential input pair's linear operating range, and a final time constant period ($t_{tc}$), where the output asymptotically approaches it's final settled state:

$$t_{st} = t_{slew} + t_{tc}.$$

The initial slew period is controlled by the input charge magnitude ($q_{ni}$) and amplifier peak output current ($I_{pkout}$). Excluding the output stray capacitance, the initial slew period ($t_{slew}$) can be approximated by the following equation:

$$t_{slew} = q_{in}/I_{pkout}.$$

The final time constant period ($t_{tc}$) is controlled by amplifier input differential device transconductance ($gm_{iput\ pair}$) and output load capacitance ($C_{load}$). The following equation gives a practical approximation:

$$t_{tc}=C_{load}/gm_{input\ pair}.$$

From these equations, it is clear that the final time constant period is minimized by simply increasing the transconductance of the input differential pair. The slew period, however, which is increased by an increase in input capacitance values, can only be reduced by increasing the peak output current of the amplifier. But, as noted at the outset, an increase in the peak output current results in a large increase in supply current in circuits with high supply current to peak output current ratios.

In light of the foregoing, there is a need for a fully complementary cascode amplifier with a decreased supply current to peak output current ratio.

SUMMARY OF THE INVENTION

Accordingly, the present invention is directed to a system and method for reducing the supply current to peak output current ratio of a fully complementary cascode amplifier. Such a reduction has the benefit of achieving both a high SNR and clock frequency while keeping supply current and power dissipation requirements manageable.

A method consistent with this invention includes the steps receiving a first input signal, receiving a second input signal, supplying current to a first output from a first current source, drawing current from the first output from a second current source, supplying current to a second output from a third current source, drawing current from the second output from a fourth current source, diverting current from the third current source and supplying current to the second current source when the first input signal is greater than the second input signal, and diverting current from the first current source and supplying current to the fourth current source when the second input signal is greater than the first input signal.

A system consistent with the present invention includes an output portion coupled to a first output terminal and to a second output terminal, a first shunt portion coupled to receive a first input signal and a second input signal, and configured to selectively divert current from the output portion based on the first and second input signals, and a second shunt portion coupled to receive the first and second input signals, and configured to selectively supply current to the output portion based on the first and second input signals.

Both the foregoing general description and the following detailed description are exemplary and explanatory and do not restrict the invention as claimed.

BRIEF DESCRIPTION OF THE DRAWINGS

The accompanying drawings, which are incorporated in and constitute a part of this specification, illustrate embodiments of the invention and, together with the description, explain the principles of the invention. In the drawings.

DETAILED DESCRIPTION

Reference will now be made in detail to the present preferred embodiment of the invention, an example of which is illustrated in the accompanying drawings. Where possible, like numerals are used to refer to like or similar components.

The current invention describes a novel mechanism by which an additional differential input pair can be added to a traditional folded cascode amplifier with a change in bias parameters to form an amplifier with improved settling characteristics and with a much desired decrease in power consumption.

Figure 2:
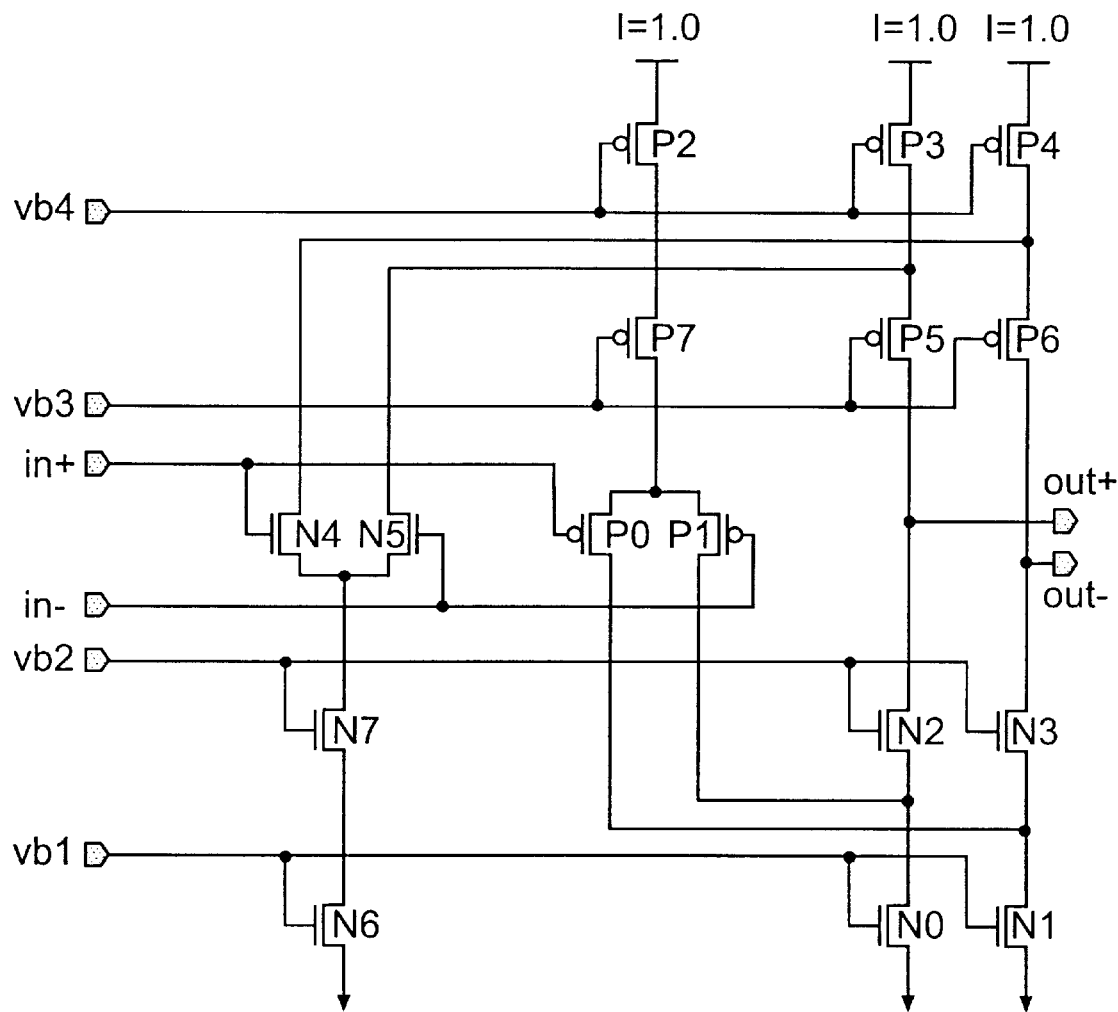
FIG. 2 is a drawing of a fully complementary cascode amplifier consistent with the present invention.

FIG. 2 schematically depicts this novel, fully complementary folded cascode differential amplifier, and the preferred embodiment of this invention. The amplifier has a first shunt portion including devices N4, N5, N6, and N7, a second shunt portion including devices P0, P1, P2, and P7, and an output portion including devices P3, P4, P5, P6, N0, N1, N2, and N3. The output portion can further be divided into four current sources: the first current source includes devices P3 and P5; the second current source includes devices N0 and N2; the third current source includes devices P4 and P6; and the fourth current source includes devices N1 and N3. A bias generator (not shown) generates fixed bias voltages Vb1, Vb2, Vb3, and Vb4 to ensure that the currents through the devices are appropriate, and all devices operate in their saturation region. As in the traditional design, the bias voltages are adjusted by the bias generator so that the outputs always remain within an acceptable output common mode voltage range. The differential pair composed of NMOS devices N4, N5 and PMOS devices P0, P1 have width-to-length (W/L) ratios such that the two pairs have similar transconductance.

When a large scale input signal is applied across input terminals in+ and in− in the amplifier of FIG. 2, the entire current conducted through a given output current source is allowed to conduct to the output. The total current consumption (excluding bias circuits) is three current units, while the peak output current is one unit, leading to a supply current to peak output current ratio of 3 to 1, a significant improvement over the traditional design of FIG. 1.

Devices P2, P3, P4, N0, N1, and N6 are appropriately scaled and biased to conduct one unit of current each. In operation, when the voltage on input terminal in+ is equal to the voltage on input terminal in−, no current flows to output terminals out+ or out−. In this case, devices N4, N5, P0, and P1 are balanced and conduct equal amounts of current. Specifically, half of the current supplied by device P3 is diverted through device N5 to ground, and half of the current supplied by device P4 is diverted through device N4 to ground. Thus, output terminals out+ and out− are each pulled high by a half unit of current. The current supplied by device P2 is similarly equally distributed between devices P0 and P1 such that each conducts a half unit of current to devices N1 and N0, respectively. Thus, output terminals out+ and out− are each simultaneously pulled to ground by a half current unit, resulting in a zero output current.

Suppose, on the other hand, the voltage on input terminal in+ is much greater than the voltage on terminal in−. This turns device N4 on and device N5 off, allowing the one current unit sourced by device P4 to flow through devices N4, N7, and N6 to ground. This also turns device P1 on and device P0 off, allowing the one current unit sourced from device P2 to flow through device P1 and through device N0 to ground. Thus, output terminal out− is pulled low by one current unit to ground by devices N1 and N3. Output terminal out+, on the other hand, outputs one current unit sourced by devices P3 and P5.

If the voltage on input terminal in− is much greater than the voltage on terminal in+, the circuit functions in the opposite manner. Specifically, the higher voltage on terminal in− turns device N5 on and device N4 off, allowing the one current unit sourced by device P3 to flow through devices N5, N7 and N6 to ground. Also, the one current unit sourced from device P2 is diverted through device P0 and through device N1 to ground. Thus, output terminal out+ is pulled low by one current unit to ground by devices N0 and N2. Output terminal out−, on the other hand, outputs one current unit sourced by devices P4 and P6.

In these latter two cases, the output current is one unit while the supply current is three units, resulting in a supply current to peak output current ratio of three to one. This represents a significant improvement over the traditional design, which results in a supply current to peak output current ratio of four to one.

Figure 1:
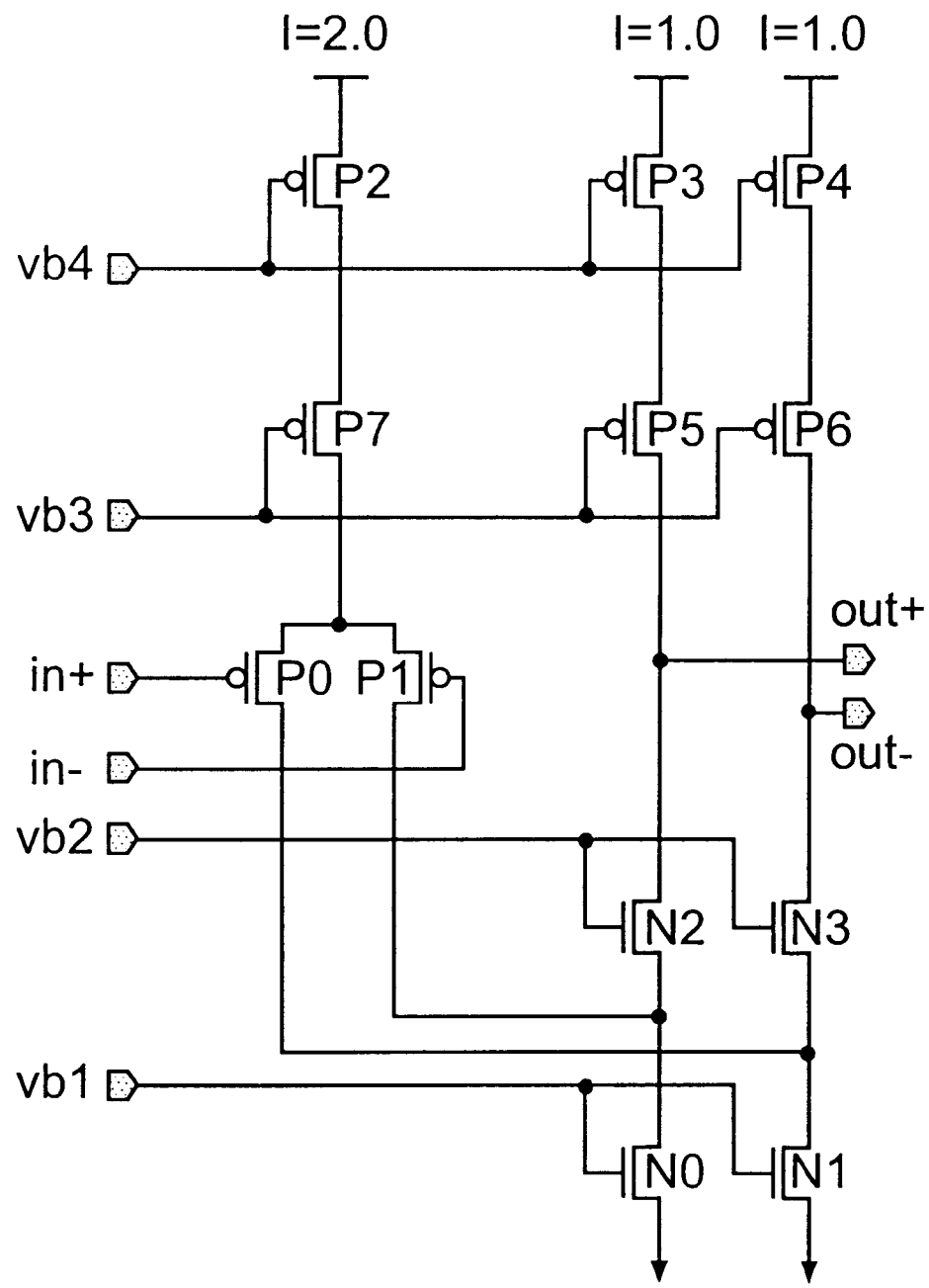
FIG. 1 is a drawing of a traditional, fully complementary cascode amplifier.

In sum, the folded cascode amplifier of FIG. 1 suffers from the inefficiency that both output terminals out+ and out− are, under all conditions, being acted upon by the positive current sources P3 and P4. The present invention solves this problem by adding an additional differential input pair allowing all current sources attached to the output terminals to be affected by the input signal.

Further, the traditional design of FIG. 1 suffers from differential asymmetry due to the asymmetrical nature of a single differential input pair P0, P1 within an otherwise fully differential design. This leads to asymmetrical slew and settling waveforms, which places an additional transient error component at the output, a burden for the common mode circuitry to correct. In the novel, fully complementary folded cascode amplifier design of FIG. 2, such asymmetry is reduced substantially by introduction of the differential input pair composed of N4, N5 and P0, P1, leading to more symmetrical waveforms and a smaller transient common mode disturbance during settling.

It will be apparent to those skilled in the art that various modifications and variations can be made in the present invention without departing from the spirit or scope of the invention. It is intended that the present invention cover the modifications and variations of this invention provided they come within the scope of the appended claims and their equivalents.

I claim:

1. A method for improving the supply current to output current ratio in a fully complementary, folded cascode amplifier comprising the steps of:

receiving a first input signal;

receiving a second input signal;

supplying current to a first output from a first current source;

drawing current from the first output from a second current source;

supplying current to a second output from a third current source;

drawing current from the second output from a fourth current source;

diverting current from the third current source and supplying current to the second current source when the first input signal is greater than the second input signal; and diverting current from the first current source and supplying current to the fourth current source when the second input signal is greater than the first input signal.

2. The method of claim 1 wherein the steps of diverting current include the step of diverting the current to ground.

3. A fully complementary, folded cascode amplifier with improved supply current to output current ratio comprising:

an output portion coupled to a first output terminal and to a second output terminal;

a first shunt portion coupled to receive a first input signal and a second input signal, and configured to selectively divert current from the first output terminal of the output portion based on the relative magnitudes of the first and second input signals; and a second shunt portion coupled to receive the first and second input signals, and configured to selectively simultaneously with the first shunt portion supply current to the second output terminal of the output portion based on the relative magnitudes of the first and second input signals.

4. The amplifier of claim 3, wherein the output portion includes:

a first current source configured to supply current to the first output terminal;

a second current source configured to draw current from the first output terminal;

a third current source configured to supply current to the second output terminal; and a fourth current source configured to draw current from the second output terminal.

5. The amplifier of claim 4, wherein the first shunt portion includes:

a first switch coupled to the third current source and to the first input signal; and a second switch coupled to the first current source and to the second input signal.

6. The amplifier of claim 5, wherein the second shunt portion includes:

a third switch coupled to the fourth current source and to the first input signal; and a fourth switch coupled to the second current source and to the second input signal.

7. The amplifier of claim 4, wherein:

the first shunt portion is configured to divert current from the third current source when the first input signal is greater than the second input signal, and is configured to divert current from the first current source when the second input signal is greater than the first input signal.

8. The amplifier of claim 4, wherein:

the second shunt portion is configured to supply current to the second current source when the first input signal is greater than the second input signal, and is configured to supply current to the fourth current source when the second input signal is greater than the first input signal.

9. The amplifier of claim 3, wherein the first and second shunt portions and the output portion are constructed with CMOS devices.

* * * * *

UNITED STATES PATENT AND TRADEMARK OFFICE
Certificate

Patent No. 6,043,708                                                    Patented: March 28, 2000

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Keith Barr and Frank Thomson.

Signed and Sealed this Second Day of January, 2001.

ROBERT PASCAL
*Supervisory Patent Examiner*
Art Unit 2817